United States Patent [19]

Howe et al.

[11] 4,103,291

[45] Jul. 25, 1978

[54] LEAK SENSOR AND INDICATING SYSTEM FOR VACUUM CIRCUIT INTERRUPTERS

[76] Inventors: Francis M. Howe, 2741 Calle La Cruz, Carmel, Calif. 93921; Simon Yin, 40934 Camero Pl., Fremont, Calif. 94538

[21] Appl. No.: 728,198

[22] Filed: Sep. 30, 1976

[51] Int. Cl.² ............................................. G08B 21/00
[52] U.S. Cl. ............................... 340/522; 200/144 B; 340/605; 361/120; 340/644
[58] Field of Search ............... 340/236, 242, 248, 253; 200/144 B; 361/120

[56] References Cited

U.S. PATENT DOCUMENTS

| | | | |
|---|---|---|---|
| 3,403,297 | 9/1968 | Crouch | 340/236 X |
| 3,889,079 | 6/1975 | Emmerich et al. | 200/144 B |

*Primary Examiner*—Harold I. Pitts
*Assistant Examiner*—Daniel Myer

[57] ABSTRACT

A leak sensor powered directly by the circuit voltage being controlled by the vacuum circuit interrupter and continuously operating while the interrupter is in service. An indicating system is connected to the leak sensor, or sensors, and provides an indication of failure and corrective action to be taken in single phase or multi-phase circuits.

15 Claims, 4 Drawing Figures

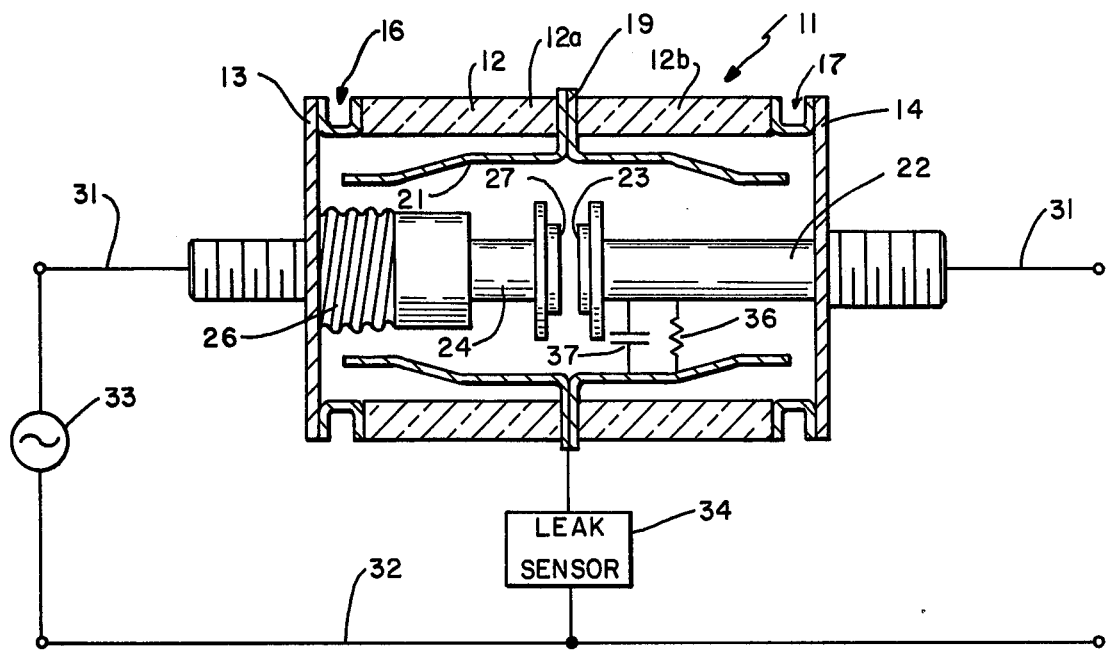
FIG.—1
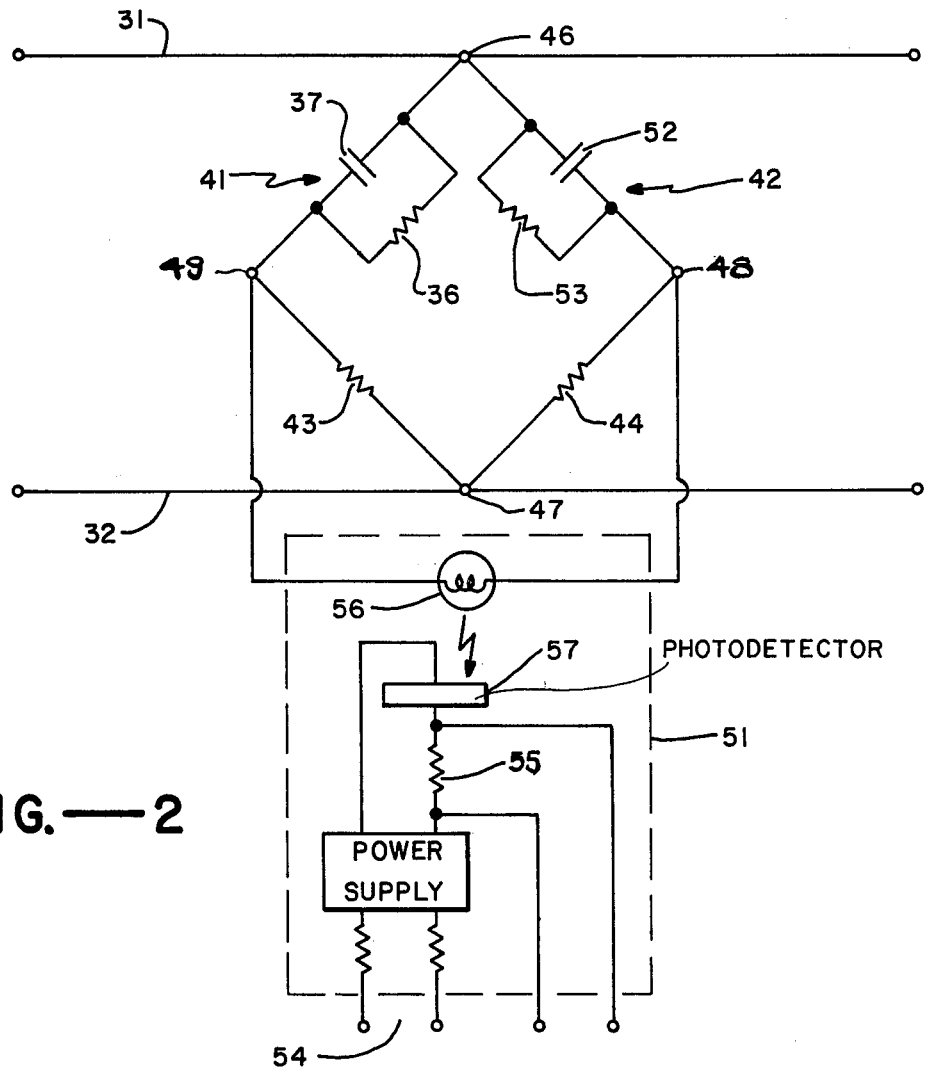
FIG.—2

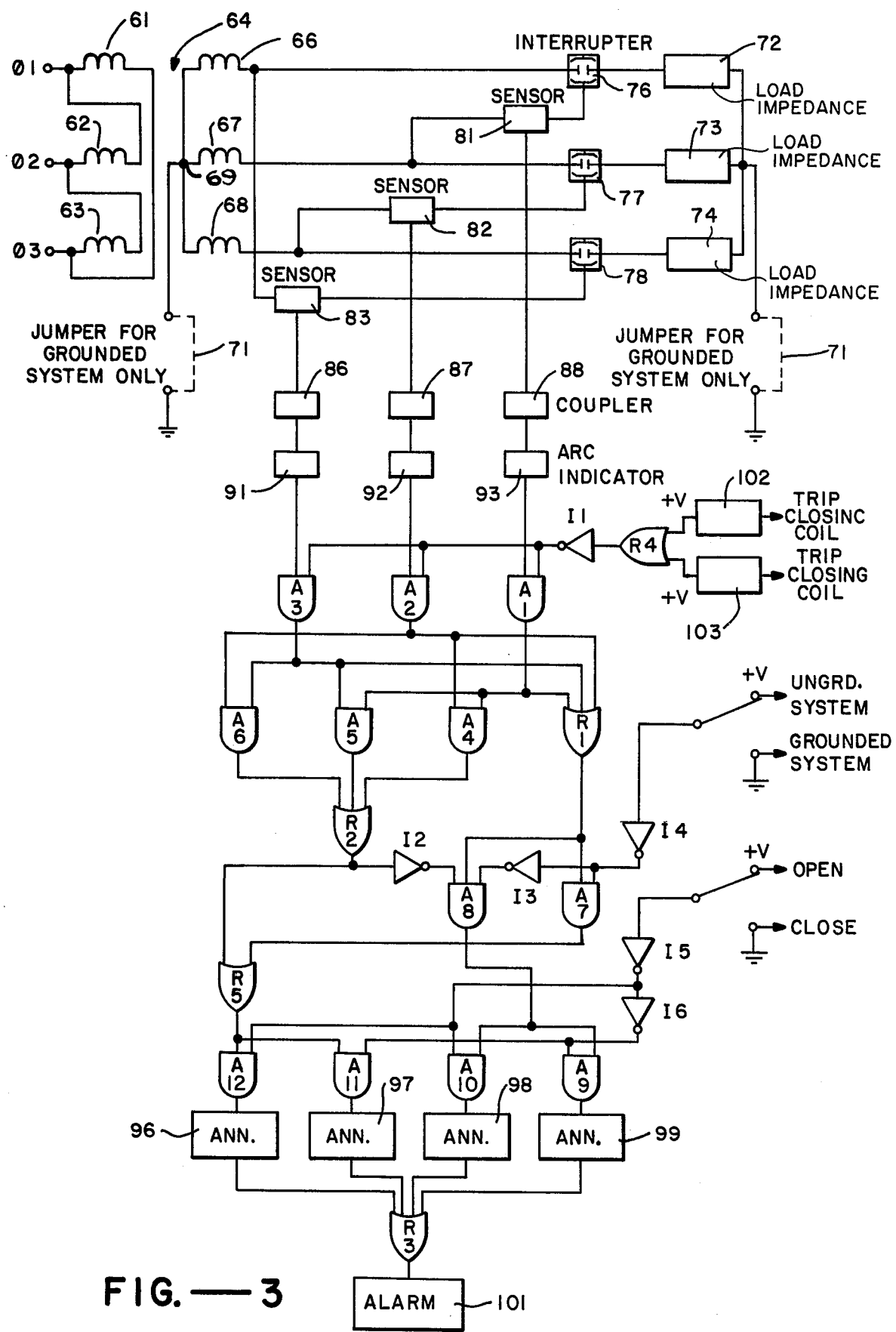
FIG.—3

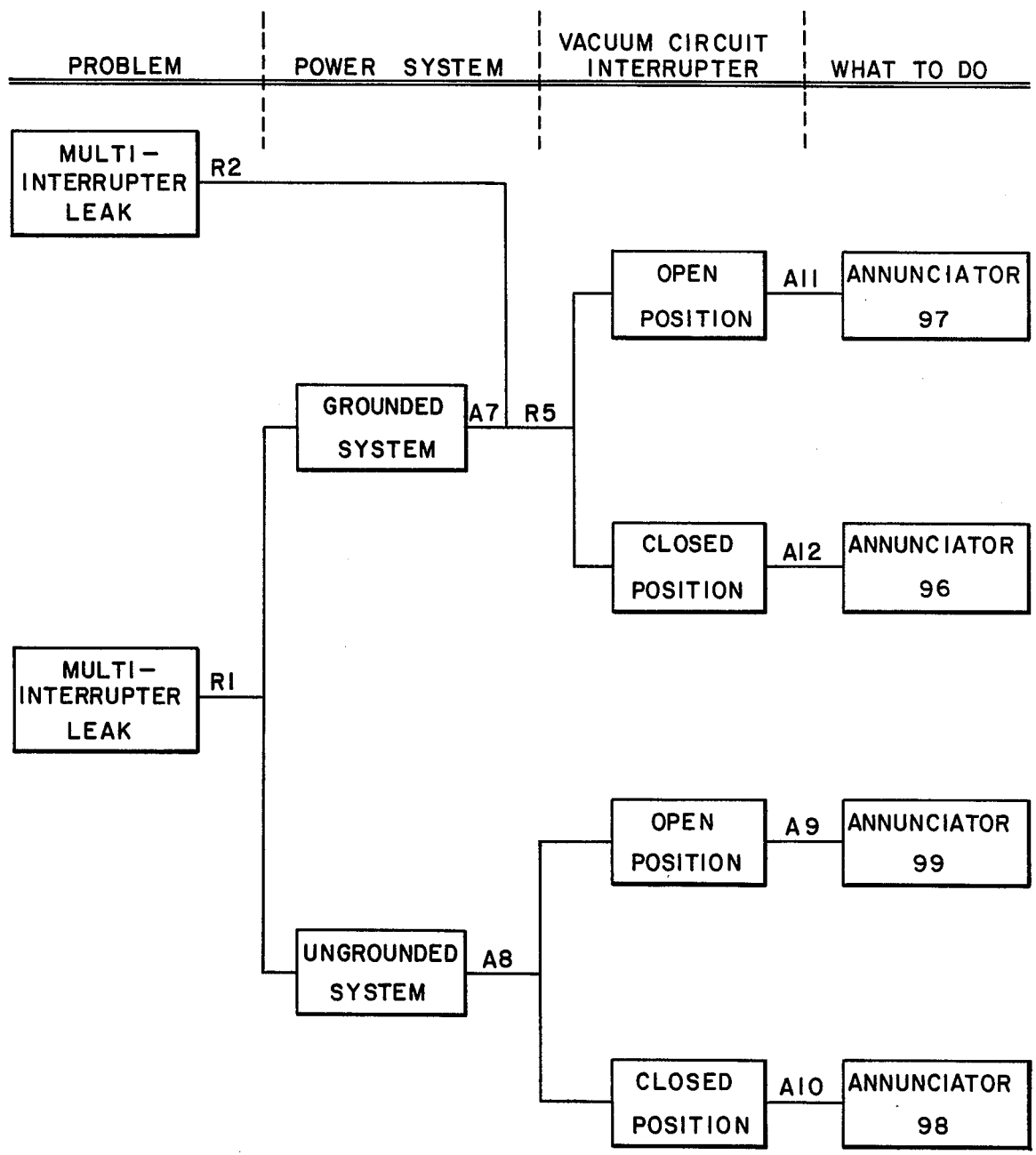
FIG.—4

LEAK SENSOR AND INDICATING SYSTEM FOR VACUUM CIRCUIT INTERRUPTERS

BACKGROUND OF THE INVENTION

This invention relates generally to a leak sensor apparatus for measuring the leakage in vacuum circuit interrupters and an indicating system adapted to be connected to one or more leak sensors to provide an indication of leakage and instructions for replacing a faulty vacuum circuit interrupter.

The superior characteristics of vacuum as a dielectric make its use in power interrupting devices preferred over the use of special arc extinguishing materials, such as gases and liquids. Since vacuum offers a dielectric strength with a recovery rate of several thousand volts per microsecond, interruption can normally be anticipated at the first current zero in an A.C. current waveform. Furthermore, the total contact stroke required in a vacuum interrupter is a fraction of an inch. The short stroke provides low mass and inertia which results in high operating speed and low mechanical shock.

Normally, the total sequence from fault to clear may be accomplished in less than three cycles. Since energy dumped into a fault is proportional to time, the faster clearing action means less damage, lower contact erosion, longer maintenance free contact life, and maximum equipment protection. Thus it is desirable to employ vacuum interrupters.

A problem with the use of vacuum circuit interrupters is that if there is a loss of vacuum as by leakage of air through a crack caused by undue mechanical stresses, both the high strength of the vacuum dielectric and the rapid recovery characteristics are lost. The small electrode spacing will no longer be able to sustain the high voltages. Arcs and flashovers will occur. The white hot arc will burn the electrode and melt the envelope, and may even extend into and attack other parts of the interrupter assembly. Such leaks are not visible to an operator and failure has in the past been detected by complex measurements.

Desirability of measuring the pressure inside a vacuum interrupter to anticipate failure has long been recognized. In recent years pressure measuring systems for vacuum circuit interrupters have been developed. One such pressure measuring system is described in U.S. Pat. No. 2,864,968. The system employs a DC voltage applied between electrodes to cause electrons to be emitted. The electrons collide with any gas molecule within the envelope and positive ions will flow to the shield which is maintained at a negative potential. A measuring circuit is connected to the shield and measures the current. An increase in current indicates loss of vacuum. U.S. Pat. No. 3,263,162 describes a system which is connected between the shield and one electrode to provide a voltage therebetween and the current flow is then sensed. If there is a leak, ions are formed and the current flow indicates the loss of vacuum. The system includes a separate D.C. power supply and means providing a magnetic field for directing the ions in a helical path.

In power systems it is important to know whether a leak has occurred while the contacts are open or closed during operation of the circuit with which the interrupter is associated. If a leak is sensed while the contacts are open in a three phase ungrounded system, it is possible to remove and replace the vacuum circuit interrupter without danger of catastrophic arcing during removal. On the other hand, if the leak occurs when the contacts are closed in a grounded three phase system, the power must be turned off upstream of the current interrupter in order to be able to remove and replace the interrupter. If this is not done, an arc will be drawn and the equipment damaged when the interrupter is removed.

OBJECTS AND SUMMARY OF THE INVENTION

It is a general object of the present invention to provide an improved vacuum sensor for vacuum circuit interrupters.

It is another object of the present invention to provide a vacuum sensor which operates from the line voltages which are being controlled by the vacuum circuit interrupter to continuously monitor the vacuum within the vacuum interrupter.

It is an object of the present invention to provide an indicating system which indicates the location of the fault, the state of the vacuum circuit interrupter, and the measures which must be taken to replace the faulty interrupter.

The foregoing and other objects of the invention are achieved by employing a balanced A.C. bridge circuit in which one of the legs includes the leakage resistance and stray capacitance between the shield and electrodes of the circuit interrupter while the other legs are provided with high impedances to balance the bridge for a circuit interrupter operating at normal high vacuum. As leakage occurs, the phase and the magnitude of the leakage current changes and the bridge is unbalanced. The unbalance is detected to indicate leakage. Additionally, there is provided an indicating circuit responsive to signals from leak sensors and serving to identify the circuit interrupter which is faulty and the action which must be taken by the operator to replace the leaky vacuum circuit interrupter.

BRIEF DESCRIPTION OF THE DRAWINGS

FIG. 1 is a sectional view of a vacuum circuit interrupter incorporating a leak sensor in accordance with the present invention.

FIG. 2 is a circuit diagram of an A.C. leak sensor bridge in accordance with the invention.

FIG. 3 is a circuit diagram of an indicating system associated with the leak sensors in a three phase power system.

FIG. 4 is a flow chart showing operation of the indicating system.

DETAILED DESCRIPTION OF THE PREFERRED EMBODIMENT

Referring to FIG. 1, there is shown a vacuum circuit interrupter of the type including a vapor shield. The interrupter includes a vacuum envelope 11 including a cylindrical insulating side wall 12, and metallic end walls 13 and 14. The end walls are sealed to the side wall by means of vacuum seals 16 and 17. The insulating wall 12 may be made of any suitable ceramic material or glass. The seals 16 and 17 may be Kovar seals, which are bonded to the end walls 13 and 14 and the envelope portion 12. As shown, the envelope 12 includes portions 12a and 12b with a ring shaped support 19 supported and sealed therebetween. The ring serves to support the metallic shield 21. As is well-known, the metallic shield serves to intercept any metal particles which are generated during the opening and the closing of the contacts due to arcs. If the shield were not present to prevent the metallic particles from depositing on the inner walls of the envelope 12 a thin metallic layer would be formed shorting the end walls 13 and 14 to one another.

The end wall 14 supports a stationary electrode 22 having the contact 23. The end wall 13 supports a movable electrode 24. The electrode 24 is supported from the wall by a bellow 26 having one end sealed to the end wall 13 and the other to the electrode. The electrode 24 may be moved toward and away from the electrode 22 so that its contact 27 may make electrical contact with the contact 23. Not shown are the drive means for the movable electrode or the means for supporting the vacuum interrupter. A power circuit including power line 31 which is interrupted or opened by the vacuum circuit interrupter and ground or return line 32 is shown. The power applied to the line is schematically shown at 33. A leak sensor 34 in accordance with the invention is connected between ground or the return line 32 and the shield line 21. The shield is in turn coupled to the electrodes by leakage resistance 36 and stray capacitance 37.

Referring now particularly to FIG. 2, the leak sensor is shown in greater detail. The sensor comprises a balanced bridge having first, second, third and fourth legs or arms 41, 42, 43 and 44 respectively. A pair of opposite terminals 46 and 47 are connected between the lines 31 and 32 and the other pair of terminals 48 and 49 are connected to a sensing and coupling circuit 51. The leakage resistance 36 and stray capacitance 37 are shown in the arm 41. Capacitor 52 and resistor 53 are shown connected in the leg 42 and are selected to have substantially the same values of resistance and capacitance as the leak resistance and capacitance. Resistors of substantially the same magnitude are connected in the legs 43 and 44 whereby under normal operating conditions the bridge is balanced and there is no output of the sensing circuit 51. When leakage occurs ions are formed in the envelope causing bridge unbalance because of the change in leakage resistance. The output current of the bridge phase and magnitude will therefore change. Leakage may be sensed in the bridge by a phase detecting circuit or by an amplitude detecting circuit 51.

The sensing circuit shown comprises a light emitting diode 56 which when illuminated is coupled to a photoresistor or detector 57. The photoresistor is connected to a power supply. Current flow through the circuit is dependent upon the light intensity. An output voltage may be obtained by connecting across resistor 55 connected in a series with the photoresistor 57. An output voltage indicates leakage. Of course, more complex sensing circuits may be connected between the terminals 48 and 49 of the bridge. For example, an amplitude and phase measuring circuit may be employed.

Thus, there has been provided a leak sensor connected to the metallic shield which is basically a modified A.C. bridge with the leakage resistance and stray capacitance serving as one of the combined impedance arms, the remaining arms of the bridge are selected to provide balance so there will normally be no output. When there is leakage, there is a change in magnitude and phase angle of the signal and the bridge goes out of balance. The sensor detects the abnormal condition and translates it into a discernible logic level change signal such as a voltage level. In the circuit shown, the indicating or logic signal is isolated from the high voltage signals on the bridge and circuit by using a light coupling. However, other methods of coupling may be employed such as a shielded transformer having its primary connected in circuit between the terminals 48 and 49 and the secondary connected to a sensing or indicating system.

As previously described, leakage in any vacuum circuit interrupter with which a sensor is associated provides an output logic or control signal. Also, as previously described, it is desirable to be able to employ this logic signal, together with other signals, to identify the specific vacuum circuit interrupter which has lost vacuum, sound an alarm, and provide instructions to an operator. Vacuum circuit interrupters of the type just described are generally employed in three phase power systems operating at relatively high voltage. Referring specifically to FIG. 3, there is shown schematically three phase wye system with a three phase load. The system input terminals connected to the primaries 61, 62 and 63 of a transformer 64 with the secondaries 66, 67 and 68 are connected in a wye circuit with the common terminal 69 either grounded or ungrounded, depending upon the position of the jumpers 71. The transformers are connected to load impedances 72, 73 and 74, which are also connected in a wye configuration and can either be grounded or ungrounded, depending on the position of the jumper 72.

Vacuum circuit interrupters 76, 77 and 78 of the type just described are connected in series with each of the power lines. Also connected between the vacuum interrupter shields and one of the other power lines of the three phase circuit are sensors 81, 82 and 83 of the type previously described and which operate with the voltage between pairs of the three phase lines. The output of the sensors is applied to couplers 86 and 87 and 88 which serve to isolate the high voltage system from the low voltage indicating system. The output of the couplers is applied to indicators 91, 92 and 93. As previously described when vacuum interrupters have the proper vacuum, the output signals from the couplers 86, 87 and 88 will be a logical zero (zero volts). None of the indicators 91, 92 and 93 will be energized. Also, as will presently become apparent, none of the annunciators 96, 97, 98 or 99 will be energized and the alarm 101 will not be activated.

When an opening or closing operation of the vacuum circuit interrupter is performed with high voltage applied to the breaker's primary contacts, the vacuum sensors momentarily will be driven out of balance. This is due to the arcing which will take place in each interrupter and the release of particles which will cause momentary conduction and imbalance of the bridge. A logical 1 output will be present at the output of each coupler 86, 87 and 88. This will momentarily light arcing indicators 91, 92 and 93. Since this is a normal condition, the vacuum sensor logical 1 outputs that result from an opening or closing operation must not be allowed to sound the alarm or light any of the annunciators 96, 97, 98 or 99. It should be noted that the momentary lighting of the arching indicators provides the operator with a check of the operation of the vacuum sensors, the couplers, and the arcing indicators.

The OR gate R4 and inverter I1 inhibit operation of the annunciators and alarm. The inputs of OR gate R4 are connected to circuits 102 and 103 which provide a logical 1 whenever an opening or closing signal is applied to the trip opening or closing coils. Inverters I1 inverts this logical 1 output to a logical 0 and applies the logical 0 to the inputs of AND gates A1, A2 and A3. The outputs of A1, A2 and A3 are thus forced to have logical 0 levels, regardless of the vacuum sensor outputs whenever the breaker receives an opening or closing command. This, in effect, isolates the outputs of the vacuum sensors from the logic circuitry whenever an opening or closing operation is performed.

The leak detection and control logic circuitry operation is described for a single interrupter leak. Assume that a leak has occurred in interrupter 76 and that the resulting logical 1 output of vacuum sensor 81 has caused coupler 88 to also have a logical 1 output. The logical 1 output of coupler 88 lights arcing indicator 93 and is applied to one input of AND gate A1. Assuming that neither a closing signal nor an opening signal is being applied to the breaker, the inputs of OR gate R4 are both at logical 0 levels. The resulting logical 0 output of R4 is inverted to a logical 1 by inverter I1 and applied to AND gate A1 causing the output of A1 to be a logical 1. The logical 1 output of A1 is applied to OR gate R1 and forces the output of R1 to be a logical 1.

The outputs of AND gates A2 and A3 are logical zeros since it is assumed that interrupters 77 and 78 have not lost vacuum and the outputs of their respective vacuum sensors are at logical 0 levels. Since the outputs of A2 and A3 are both logical zeros the outputs of AND gates A4, A5 and A6 are also at logical 0 levels. The logical 0 outputs of A4, A5 and A6 are applied to the inputs of OR gate R2, forcing the output of R2 to be a logical 0. In the same manner as described, a single interrupter leak of either of the other two will in all cases cause OR gate R1 to have a logical 1 output and OR gate R2 to have a logical 0 output.

At this point an assumption must be made concerning the type of system in which the breaker is being operated. It will first be assumed that the system is of the grounded type. Later it will be assumed that the system is of the ungrounded type.

If the system in which the interrupter is operated is of the grounded type, switch S1 should be set in the lower position so that a logical 0 is applied to inverter I4. The logical 1 output of I4 is applied to one input of AND gate A7. The other input of A7 is connected to the output of R1. As already determined, the output of R1 is a logical 1. Both inputs of A7 are therefore at logical 1 levels and the output of A7 is a logical 1. This logical 1 output of A7 is applied to OR gate R5 causing its output to be a logical 1. The logical 1 output of R5 is applied to both AND gates A11 and A12 as shown.

If the breaker is in the open position, the auxiliary switch is placed in the upper position and applies a logical 1 to inverter I5. The logical 0 output of inverter I5 is inverted to a logical 1 by inverter I6 and applied to AND gate A11. Combined with the logical 1 input from R5, this causes A11 to have a logical 1 output. The logical 1 output of A11 lights annunciator 97 and energizes the alarm across OR gate R3. In the present system, the annunciators indicate to the operator the proper action to be taken in accordance with the following table:

TABLE I

| ANNUNCIATOR | LEGEND |
|---|---|
| 97 | 1) Do not draw out breaker.<br>2) Have your power line cleared immediately.<br>3) Draw out breaker for repair. |
| 96 | 1) Do not open breaker.<br>2) Have your power line cleared immediately.<br>3) Open breaker.<br>4) Draw out breaker for repair. |
| 99 | 1) Draw out breaker for repair. |

TABLE I-continued

| ANNUNCIATOR | LEGEND |
|---|---|
| 98 | 1) Trip open breaker.<br>2) Draw out breaker for repair. |

Annunciator 97 indicates to the operator the proper set of instructions that should be followed for a single interrupter leak in a breaker which is in the open position and operating in a grounded system.

If instead of being in the open position the breaker is in the closed position, the auxiliary switch is in the lower position and applies a logical 0 signal to the input of inverter I5. The logical 1 output of inverter I5 is applied to AND gate A12. Combined with the logical 1 input from R5, this causes the output of A12 to be a logical 1. The logical 1 output of A12 lights annunciator 96 and energizes the alarm across OR gate R3. Annunciator 96 indicates to the operator the proper set of instructions that should be followed for a single interrupter leak in a breaker which is in the closed position and operating in a grounded system.

If the system is of the ungrounded type, switch 1 should be in the upper position so that it applies a logical 1 to the input of inverter I4. The logical 0 output of I4 is applied to inverter I3 causing the output of I3 to be a logical 1. This logical 1 is applied to AND gate A8. As discussed, for a single interrupter leak the output of R1 is a logical 1 and the output of R2 is a logical 0. The logical 1 output of R1 is applied directly to A8 and the logical 0 output of R2 is inverted to a logical 1 by inverter I2 and also applied to A8. Each of the three inputs of A8 is therefore at a logical 1 level and the output of A8 is a logical 1. The logical 1 output of A8 is applied to both AND gates A9 and A10 as shown.

If the breaker is in the open position, the auxiliary switch applies a logical 1 to inverter I5. The logical 0 output of inverter I5 is inverted to a logical 1 by inverter I6 and applied to AND gate A9. Combined with the logical 1 input from A8, this causes A9 to have a logical 1 output. The logical 1 output of A9 lights annunciator 99 and energizes the alarm across OR gate R3. Annunciator 99 indicates to the operator the proper set of instructions that should be followed for a single interrupter leak in a breaker which is in the open position and operating in an ungrounded system.

If instead of being in the open position the breaker is in the closed position, the auxiliary switch applies a logical 0 signal to the input of inverter I5. The logical 1 output of inverter I5 is applied to AND gate A10. Combined with the logical 1 input from A8, this causes the output of A10 to be a logical 1. The logical 1 output of A10 lights annunciator 98 and energizes the alarm across OR gate R3. Annunciator 98 indicates to the operator the proper set of instructions that should be followed for a single interrupter leak in a breaker which is in the closed position and operating in an ungrounded system.

The following describes the operation of the leak detection and control logic circuitry in the event of a multi-interrupter leak. Assume that interrupters 76 and 77 have lost vacuum. The general operation of the leak detection and control logic circuitry for any multi-interrupter leak, be it in all three interrupters or any two of the three, should be obvious from the following explanation.

If it is assumed that both vacuum circuit interrupters 76 and 77 have lost vacuum, then both vacuum sensors 81 and 82 must have logical 1 outputs. The logical 1 outputs of vacuum sensors 81 and 82 cause the outputs of couplers 87 and 88 t0 also be at logical 1 levels. The logical 1 outputs of couplers 87 and 88 light arc indicator 92 and 93 indicating the loss of vacuum in the interrupters. The outputs are applied to the inputs of AND gates A1 and A2.

Assuming there is neither a closing signal nor an opening signal, the inputs of OR gate R4 are both at logical 0 levels. The resulting logical 0 output of R4 is inverted to a logical 1 by inverter I1 and applied to the inputs of AND gates A1, A2 and A3. A1 and A2 will thus have logical 1 outputs. Had interrupter 78 also lost vacuum A3 would have a logical 1 output as well. The logical 1 outputs of A1 and A2 are applied to the inputs of AND gate A4 forcing the output of A4 to be a logical 1. The logical 1 output of A4 is applied to the input of R2 causing the output of R2 to be a logical 1. It should be noted that a multi-interrupter leak will always cause the output of R2 to be a logical 1. The logical 1 output of R2 is applied to OR gate R5 causing a logical 1 output at R5. The logical 1 output of R5 is applied to both AND gates A11 and A12 as shown.

If the breaker is in the open position, the auxiliary switch is in position 1 and applies a logical 1 to inverter I5. The logical 0 output of inverter I5 is applied to inverter I6. The logical 1 output of I6, combined with the logical 1 output of R5, forces AND gate A11 to have a logical 1 output. The logical 1 output of A11 lights annunciator 97 and energizes the alarm across OR gate R3. Annunciator 97 indicates to the operator the proper set of instructions that should be followed for a multi-interrupter leak in a breaker which is in the open position.

If instead of being in the open position the breaker is in the closed position, the auxiliary switch applies a logical 0 to the input of inverter I5. The logical 1 output of I5 combined with the logical 1 output of R5 forces the output of AND gate A12 to be a logical 1. The logical 1 output of A12 lights annunciator 96 and energizes the alarm across R3. Annunciator 96 indicates to the operator the proper set of instructions that should be followed for a multi-interrupter leak in a breaker which is in the closed position. The operation of the logic circuit to provide an indication of other combination of faults can easily be followed in accordance with the procedures just outlined. A logic flow diagram for the above is shown in FIG. 4 with the relevant OR and AND gates indicated.

There has, therefore, been provided a system which provides an alarm 101, an indication of the defective interrupter 91, 92 or 93 and instructions 96, 97, 98 and 99 by the combination of simple logic means.

What is claimed is:

1. A leak sensor for vacuum circuit interrupters of the type which include an evacuated envelope, a pair of separable electrodes within the envelope adapted to be connected in series with the circuit, and a metal shield surrounding the electrodes and shielding the envelope against metal deposits comprising a bridge circuit including four arms and four terminals, the impedance in one of said arms being the resistance and leakage stray capacitance between the shield and at least one of said electrodes, said electrode and said shield connected to adjacent bridge terminals, the impedance in the remaining arms being selected to balance the bridge when the vacuum circuit interrupter is operating with normal vacuum, a pair of opposite terminals of said bridge including said electrode bridge terminal being connected to the circuit in which the interrupter is connected to derive its operating voltage directly and continuously therefrom, and means connected to the other pair of terminals serving to sense bridge unbalance and provide an output signal indicative of loss of vacuum in the vacuum circuit interrupter.

2. A leak sensor for vacuum circuit interrupters as in claim 1 wherein the circuit is an AC circuit and said bridge is an ac bridge.

3. A leakage sensor for vacuum circuit interrupters as in claim 1 wherein said means connected to the other pair of terminals serving the sense the bridge unbalances senses signal amplitude.

4. A leak sensor for vacuum circuit interrupters as in claim 3 in which said means connected to the other pair of terminals serving to sense bridge unbalances to provide signals indicative of loss of vacuum comprises a measuring circuit capable of measuring phase and amplitude.

5. A leak sensing and indicating system for vacuum circuit interrupters of the type having electrodes connected to control a power circuit comprising a leak sensor connected to receive power from said power circuit and sense leakage in the vacuum circuit interrupter and provide an output signal indicative of leakage, an alarm, means serving to activate the alarm when there is an output signal indicative of leakage, and means for inhibiting the application of said output signal to said alarm during opening or closing of the circuit interrupter electrodes whereby the alarm is not sounded as a result of currents induced by the release of particles during arcing which takes place on opening and closing of the interrupter.

6. A system as in claim 5 wherein said inhibiting means comprises a gate circuit connected to receive said signal, and means serving to provide an inhibit signal to said gate circuit during opening and closing of the interrupter electrodes.

7. A leak sensor as in claim 5 including means for indicating the presence of a leakage signal.

8. A leak sensor sensing and indicating system as in claim 5 wherein said leak sensor derives its operating power continuously from the power circuit to thereby continuously monitor the circuit interrupter.

9. A leak sensing and indicating system for use in connection with vacuum circuit interrupters having electrodes connected in the power line of a three phase power system of the grounded or ungrounded type including a leak sensor connected in circuit with each of said vacuum circuit interrupters to receive power from the power system, means connected to each of said sensors to provide an output signal indicative of leakage, an alarm, means serving to activate the alarm when there is an output signal indicative of leakage and means connected to receive the output signal from each of said leakage sensors for inhibiting application of the leakage signal to said alarm during opening and closing of the vacuum circuit interrupter electrodes whereby the alarm is not sounded as a result of currents induced by the release of particles during arcing which takes place on opening and closing of the interrupter.

10. A leak sensing and indicating circuit as in claim 9 wherein said inhibiting means comprise a gate circuit connected to receive said output signal from each of said sensors, and means serving to provide an inhibit signal to each of said gate circuits to inhibit the gate during opening and closing of the electrodes.

11. A leakage sensing and indicating system as in claim 9 which includes means with each of said sensor circuits for providing an indication of leakage.

12. A leakage sensing and indicating system for use in connection with vacuum circuit interrupters in the power lines of a three phase power system of the grounded or ungrounded type including a plurality of leak sensors connected to each of said vacuum circuit interrupters, circuit means connected to each of said sensors serving to provide an output signal indicative of leakage, a plurality of annunciators serving to provide an operator instructions regarding replacement of a leaky vacuum interrupter, an alarm means connected to receive an output from any of said annunciators and provide an alarm, logic circuit means connected to receive the output signal from each of said circuit means and provide a signal to the annunciator which announces the proper instructions, means associated with said logic circuit for providing a signal indicative whether the three phase system is grounded or ungrounded whereby to control the logic means so that said output signals are directed to the proper annunciator.

13. A leakage sensor system as in claim 12 additionally including means for providing an input signal indicative of open or closed interrupter electrodes to said logic circuit and additional logic means in said logic circuit for controlling the application of signals to said annunciators responsive to said input signal.

14. A leakage sensing and indicating system for use with vacuum circuit interrupters connected in each of the power lines of a three-phase system of the grounded or ungrounded type; said vacuum circuit interrupters each including a vacuum envelope, a pair of separable electrodes in said envelope adapted to be connected in series with said power lines and a metal shield surrounding the electrodes; an AC bridge circuit including four arms connected to each of said interrupters, the impedance in one of said arms being the leakage resistance and stray capacitance between the shield and the electrodes, the impedance of the remaining arms selected to balance the bridge when the vacuum circuit interrupter is operating with normal vacuum, a pair of opposite terminals of said bridge being connected to receive power directly and continuously from said circuit, means connected to the other arms serving to sense bridge unbalance and provide an output signal indicative of leakage, a plurality of annunciators serving to provide an operator instructions regarding replacement of a leaky vacuum interrupter, an alarm means connected to receive an output from any of said annunciators and provide an alarm, logic circuit means connected to receive the output signal from each of said circuit means and provide a signal to annunciator which announces the proper instructions, means associated with said logic circuit for providing a signal indicative whether the three phase system is grounded or ungrounded whereby to control the logic means so that said output signals are directed to the proper annunciator.

15. A leakage sensor system as in claim 14 additionally including means for providing an input signal indicative of open or closed interrupter electrodes to said logic circuit and additional logic means in said logic circuit for controlling the application of signals to said annunciators responsive to said input signal.

* * * * *